(12) United States Patent
Lorca Hernando (10) Patent No.: US 9,860,020 B2
(45) Date of Patent: Jan. 2, 2018

(54) METHOD, SYSTEM AND DEVICE FOR ERROR DETECTION IN OFDM WIRELESS COMMUNICATION NETWORKS

(71) Applicant: TELEFONICA, S.A., Madrid (ES)

(72) Inventor: Javier Lorca Hernando, Madrid (ES)

(73) Assignee: TELEFONICA, S.A., Madrid (ES)

( * ) Notice: Subject to any disclaimer, the term of this patent is extended or adjusted under 35 U.S.C. 154(b) by 0 days.

(21) Appl. No.: 15/195,436

(22) Filed: Jun. 28, 2016

(65) Prior Publication Data

US 2016/0380725 A1    Dec. 29, 2016

(30) Foreign Application Priority Data

Jun. 29, 2015  (EP) .................................. 15382344

(51) Int. Cl.

| | | |
|---|---|---|
| *H03M 13/00* | (2006.01) | |
| *H04L 1/00* | (2006.01) | |
| *H04L 1/20* | (2006.01) | |
| *G06N 7/00* | (2006.01) | |
| *H04L 27/26* | (2006.01) | |
| *H03M 13/37* | (2006.01) | |

(52) U.S. Cl.
CPC .......... *H04L 1/0057* (2013.01); *G06N 7/005* (2013.01); *H03M 13/3784* (2013.01); *H04L 1/0055* (2013.01); *H04L 1/203* (2013.01); *H04L 27/2647* (2013.01); *H03M 13/3738* (2013.01)

(58) Field of Classification Search
None
See application file for complete search history.

(56) References Cited

U.S. PATENT DOCUMENTS

| | | | | |
|---|---|---|---|---|
| 2005/0135324 A1* | 6/2005 | Kim | ....................... | H04L 1/005 370/343 |
| 2011/0206065 A1* | 8/2011 | Kim | ..................... | H04L 1/1607 370/474 |
| 2015/0304130 A1* | 10/2015 | Logothetis | ............ | H04L 1/0003 455/115.2 |

OTHER PUBLICATIONS

European Search Report for Application No. 15382344 dated Dec. 10, 2015.
Jan Geldmarch et al., "Hard decision based low SNR early termination for Lte Turbo decoding", 2011 8th International Symposium on Wireless Communication Systems (ISWCS), IEEE, Nov. 6, 2011, pp. 26-30.
Lentmaier et al. "An Analysis of the Block Error Probability Performance of Iterative Decoding", IEEE Transactions on Information Theory, IEEE Press, USA, vol. 51, No. 11, Nov. 1, 2005, pp. 3834-3855.

* cited by examiner

*Primary Examiner* — Christine Tu
(74) *Attorney, Agent, or Firm* — Knobbe Martens Olson & Bear LLP (57) ABSTRACT

A system, method and device for error detection/estimation in OFDM communications systems is proposed. The disclosed mechanism allows an efficient error prediction in a received data block (e.g. a packet) without using error detection codes that may impair spectral efficiency (due to the overhead) especially when very small size packets are used. In order to do that, it generates a decision variable with the aim to check whether a received block has errors or not, without resorting to the use of error-detection codes.

15 Claims, 3 Drawing Sheets

METHOD, SYSTEM AND DEVICE FOR ERROR DETECTION IN OFDM WIRELESS COMMUNICATION NETWORKS

CROSS-REFERENCE TO RELATED APPLICATION

This application claims priority to European Patent Application No. 15382344.8 filed on Jun. 29, 2015, the disclosure of which including the specification, the drawings, and the claims is hereby incorporated by reference in its entirety.

FIELD OF THE INVENTION

The present invention has its application within the telecommunication sector, especially, deals with the field of error detection in Orthogonal Frequency-Division Multiple Access (OFDMA) wireless communication systems. More specifically, the present invention proposes a method, a system and a device to detect (predict or estimate) errors in a received block (e.g. a packet) in Orthogonal Frequency-Division Multiplexing (OFDM) networks (e.g., in Long-Term Evolution, LTE, networks) without using error detection codes and, therefore, avoiding the overhead due to these codes.

BACKGROUND OF THE INVENTION

LTE (Long Term Evolution) is the next step in cellular Third-Generation (3G) systems, which represents basically an evolution of previous mobile communications standards such as Universal Mobile Telecommunication System (UMTS) and Global System for Mobile Communications (GSM). It is a Third Generation Partnership Project (3GPP) standard that provides throughputs up to 50 Mbps in uplink and up to 100 Mbps in downlink. It uses scalable bandwidth from 1.4 to 20 MHz in order to suit the needs of network operators that have different bandwidth allocations. LTE is also expected to improve spectral efficiency in networks, allowing carriers to provide more data and voice services over a given bandwidth. In order to do that, LTE uses Orthogonal Frequency-Division Multiple Access (OFDMA) which is a proven access technique, based on Orthogonal Frequency-Division Multiplexing (OFDM), for efficient user and data multiplexing in the frequency domain. Other wireless standards like WiFi (IEEE 802.11) or WiMAX (IEEE 802.16) also employ OFDM techniques.

One of the advantages of OFDM is its ability to resolve the frequency components of the received signal. Frequency resolution allows the receiver to determine the received signal to interference and noise ratio (SINR) corresponding to the different frequencies of interest or subcarriers. This set of SINR values is exploited by the receiver to derive the most suitable modulation and coding format to use when link adaptation is employed in the system. The receiver can obtain such modulation and coding format, and report it to the transmitter in order to optimize the transmissions for the most suitable operating point.

On the other hand, error detection and correction in received blocks (for example in the received packets) are long-standing techniques that have achieved stunning progress in the last decades. Error detection codes have the ability to detect that an error has occurred in a packet with high reliability, at the cost of some overhead usually appended at the end of the packet. Forward Error Correction (FEC) codes can sometimes detect errors but more importantly they are able to correct them to a certain extent. When combined together, error correction and detection represent a critical part of any communications system, especially wireless communications which are prone to severe impairments from the channels.

However, error detection and correction involve significant penalty in terms of packet overhead, especially when the size of the packets is very small. As an example, typical error correction codes like convolutional coding or turbo coding of rate ⅓ introduce an overhead in terms of parity bits which is more than double of the original size of the information. Parity bits can be selectively pruned at a rate matching stage, but this in turn reduces the effectiveness of the coding scheme. Error detection codes like Cyclic Redundancy Check (CRC) require a number of appended bits that may represent a significant fraction of the information packet length (typical CRC lengths are 8, 16, 24 or 32 bits). Hence, if the packet length is significantly reduced, the overhead caused by the detection codes might be unacceptable. For this reason, applications with very small packet sizes (like some machine-type applications) may disregard the use of error detection codes (because of the packet overhead due to the appended bits), thereby leaving the receiver without the possibility to trigger any actions in response to a packet error.

Detecting (or predicting) errors in a received block can be very advantageous for a number of reasons. In uncoded systems, like some machine-type applications without any kind of error detection or correction codes, if packets with errors are detected (or predicted), a prompt response can be triggered from the network such as a request for retransmission or a similar action without having to wait for the application layer to react to a missing packet. In all cases early detection of an erroneous packet can help reducing the overall latency of the system, but the use of error detection codes incur large overheads which are unacceptable when applied to very small packets.

Therefore, some applications (as machine-type applications) with very small packet sizes can be severely degraded by the introduction of traditional error correction/detection codes but, at the same time, if errors are not detected the overall latency of the system is degraded. Introducing error correction codes is in general justified because of the savings that they can bring in signal to noise ratio, but error detection codes are hardly justified when significant part of the payload must be devoted to CRC or parity bits.

There are partial solutions to this problem involving simple retransmissions of the same information. However this results in severe penalty in terms of spectral efficiency and delay, without bringing any means to actually check whether the received block is correct or not. Other solutions simply add a suitable CRC field as in Long Term Evolution (LTE) but, as previously explained, this impairs the spectral efficiency and is not really suitable with very small packet sizes.

A different, although related, set of solutions deal with block error rate (BLER) prediction, which is quite different to block error prediction. Block error rate prediction deals with obtaining suitable average block error rates for a given received channel, which is usually characterized in the form of a signal to interference and noise ratio (SINR) or a set of SINR indications (e.g. one for each of the different frequencies of interest). These techniques yield a BLER estimate that may be useful for link adaptation or system level simulations, but are unable to actually predict whether a received packet has errors or not: all they can do is estimating the average block error rate as the long-term average of the actual observed block error probability. Examples of BLER prediction techniques are so-called Link to System techniques, like Mutual Information Effective SINR Mapping (MIESM) or Exponential Effective SINR Mapping (EESM), among others.

Hence, there is a need in the state of the art for more adequate solutions in order to estimate whether an error has occurred in a given received packet with sufficient reliability, without incurring in large overheads which involve significant penalty in terms of spectral efficiency, especially when the size of the packets is very small.

SUMMARY OF THE INVENTION

The present invention solves the aforementioned problems and overcomes previously explained state-of-the-art limitations by determining whether a received block (e.g. a packet) has errors or not in a communication system employing OFDM, without the use of any error detection codes that may impair spectral efficiency (due to the overhead) especially when very small size packets are used (as may happen in some machine-type communications).

The proposed mechanism may first obtain a set of soft metrics representing the a posteriori probabilities of the received bits, in the form of log-likelihood ratios (LLR). Simultaneously, post-detection SINR values can be obtained for each of the received bits. These SINR values can be exploited to derive a block error rate (BLER) estimate for those particular channel conditions, with the aid of so-called Effective SINR Mapping techniques, like Exponential Effective SINR Mapping (EESM) or Mutual Information Effective SINR Mapping (MIESM), among others.

A BLER estimate in insufficient for a system to determine whether an actual received block is in error or not. However, a connection exists between the actual received LLR values and the probability of error in the received block. Such probability of block error can be calculated and represents a randomly distributed variable around the previously predicted BLER estimate, with a distribution function that can be calculated from the received LLR values. With the obtained distribution function and the actual probability of block error, it is possible to derive a decision variable that can be compared with a threshold, thus allowing the receiver to evaluate whether the received block is in error or not. Reliability of the proposed block error decision can also be obtained. Reliability values that are above some threshold can be sufficient to reasonably predict whether the block is in error, and reliability values below such threshold could be taken as an error or simply disregarded, depending on the application's tolerance to errors.

According to a first aspect of the present invention a method for detecting errors in an information (data) block (sent by an OFDM transmitter) is disclosed in an Orthogonal Frequency-Division Multiplexing, OFDM, network, where the information block is received by an OFDM receiver through a communication channel and contains N bits. The receiver has a symbol detector (for example a constellation symbol detector) to obtain the received bits. The method comprises the following steps performed by the receiver in order to determine whether the received block (for example, a data or information packet) has errors or not:

a) Obtaining an a posteriori log-likelihood ratio, LLR, value for each received bit of the block (after the block has been processed by the symbol detector);

b) Calculating a probability of error for the received block, $BLEP_0$, based on the calculated LLR values;

c) Calculating (estimating) an average block error rate for the received block, based on post-detection Signal to Interference and Noise Ratios of the received bits (obtained after the detection stage);

d) Obtaining a probability density function of the block error probability, BLEP, based on the probability density function of the LLR values, where the block error probability is a random variable with a mean value given by the average block error rate;

e) Calculating a decision variable value, where the decision variable is a function of the probability density function of the block error probability and $BLEP_0$;

f) Comparing the decision variable value with a first threshold (for example, the calculated average block error rate) and determining whether the received block has errors based at least on a result of said comparison.

The network may be a Long-Term Evolution, LTE, wireless cellular system or an IEEE 802.11, WiFi, system or an IEEE 802.16, WiMAX, system, or any other type of communications network using OFDM.

The decision variable may be for example, the probability that the block error probability is higher than $BLEP_0$ or any other decision variable may be used, The method may further comprise: g) calculating a block error detection reliability, $LLR_{BlockError}$, and considering that the received block has errors only if said block error reliability is above a second threshold (that may be 0). The block error reliability may be calculated as the logarithm of the ratio between the decision variable and the average block error rate.

The probability density function of the block error probability, $f_{BLEP}(BLEP)$ may be calculated as a function of the probability density function of the LLR values using the following transformation:

$$\ln(1 - BLEP) = -\sum_{n=0}^{N-1} \ln(1 + e^{-|LLR_n|})$$

where $LLR_n$ denotes the a posteriori log-likelihood ratio of the received n-th bit of the block.

The decision variable may be defined as:

$$\int_{BLEP_0}^{1} f_{BLEP}(BLEP) d BLEP.$$

The LLR values may be defined as:

$$LLR_n \equiv \ln\frac{p(x_n = +1 \mid y)}{p(x_n = -1 \mid y)}, n = 0, \ldots, N-1,$$

where $LLR_n$ denotes the log-likelihood ratio of the received n-th bit of the block, y denotes the received signal, $x_n$ is the corresponding n-th transmitted bit and p denotes the a-posteriori probability.

The LLR values may be obtained from Forward Error Correction, FEC, decoding of the received bits (if the transmitted block include FEC bits).

The probability of error for the received block, $BLEP_0$, may be calculated as:

$$BLEP_0 = 1 - \prod_{n=0}^{N-1}\left(\frac{1}{1+e^{-|LLR_n|}}\right).$$

The block may be transmitted by an OFDM transmitter without including any error detection bits (like CRC or parity bits).

The LLR values may be obtained from soft output metrics of the received bits after constellation symbol detection.

The average block error rate for the received block may be calculated performing the following steps:
- Obtaining the post-detection SINR values for each received bit of the block (this is usually obtained from the detector after the detection stage);
- From said post-detection SINR values, calculating an effective SINR which yields the same average block error rate as the system has over an additive White Gaussian Noise channel by means of a Link to System technique (as for example, Exponential Effective SINR Mapping, EESM, Capacity Effective SINR Mapping, CESM, Logarithmic Effective SINR Mapping, LESM, or Mutual Information Effective SINR Mapping, MIESM, or any other Link to System technique).
- Calculating the average block error rate as the block error rate that would be obtained if the communication channel would have been an Additive White Gaussian Noise Channel for the effective SINR value calculated.

Another aspect of the present invention refers to an OFDM receiver for implementing the method described above at the receiver side. That is, an OFDM receiver for detecting errors in an information block received through a communication channel of an OFDM network, where the information block contains N bits, the receiver comprising:
- A (constellation) symbol detector (the soft output metrics of the received bits included in the information block are obtained from said detector);
- A processor configured to (means for):
  - Obtain a posteriori log-likelihood ratio, LLR, value for each received bit of the block (after the block has been processed by the symbol detector);
  - Calculate a probability of error for the received block, $BLEP_0$, based on the calculated LLR values;
  - Calculate an average block error rate for the received block, based on post-detection Signal to Interference and Noise Ratios of the received bits (obtained from the detection stage);
  - Calculating a probability density function of the block error probability based on the probability density function of the LLR values, where the block error probability, BLEP, is a random variable with a mean value given by the average block error rate;
  - Calculating a decision variable value, where the decision variable is a function of the probability density function of the block error probability and $BLEP_0$;
  - Comparing the decision variable value with a first threshold and determining whether the received block has errors based at least on a result of said comparison.

In another aspect of the present invention, it is provided a system which comprises an OFDM transmitter and at least one OFDM receiver (as defined before) connected to the OFDM transmitter via a wireless interface (e.g. in a LTE network).

In a last aspect of the present invention, a computer program is disclosed, comprising computer program code means adapted to perform the steps of the described method, when said program is run on proccesing means of a network entity of an OFDMA network, said proccesing means being for example a computer, a digital signal processor, a field-programmable gate array (FPGA), an application-specific integrated circuit (ASIC), a micro-processor, a micro-controller, or any other form of programmable hardware. In other words, a computer program comprising instructions, causing a computer executing the program to perform all steps of the described method, when the program is run on a computer. A digital data storage medium is also provided for storing the computer program.

Consequently, according to the invention, a method, system, device and storage medium according to the independent claims are provided. Favourable embodiments are defined in the dependent claims.

These and other aspects and advantages of the invention will be apparent from and elucidated with reference to the embodiments described hereinafter.

DESCRIPTION OF THE DRAWINGS

For the purpose of aiding the understanding of the characteristics of the invention, according to a preferred practical embodiment thereof and in order to complement this description, the following figures are attached as an integral part thereof, having an illustrative and non-limiting character.

DETAILED DESCRIPTION OF THE INVENTION

The matters defined in this detailed description are provided to assist in a comprehensive understanding of the invention. Accordingly, those of ordinary skill in the art will recognize that variation changes and modifications of the embodiments described herein can be made without departing from the scope of the invention. Also, description of well-known functions and elements are omitted for clarity and conciseness.

Of course, the embodiments of the invention can be implemented in a variety of architectural platforms, operating and server systems, devices, systems, or applications. Any particular architectural layout or implementation presented herein is provided for purposes of illustration and comprehension only and is not intended to limit aspects of the invention.

The proposed invention provides a method, system and device for error determination in OFDMA communication systems (or more generically in OFDM communications sytems) as for example LTE networks or any other type of OFDM networks. The proposed mechanism allows an efficient error prediction in a received data block (e.g. a packet) without using error detection codes. In order to do that, it generates a decision variable with the aim to check whether a received block has errors or not, without resorting to the use of error-detection codes.

Figure 1:
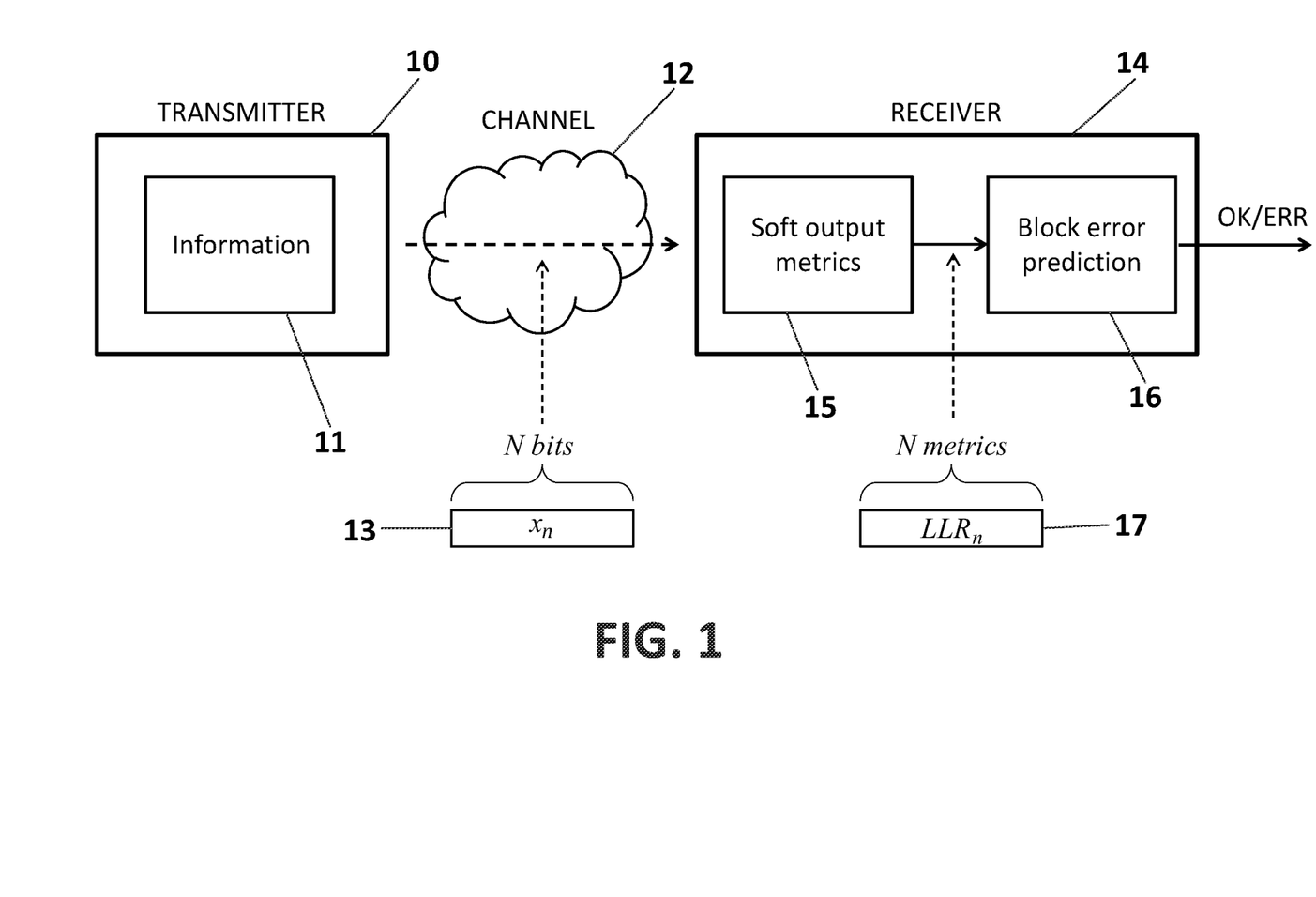
FIG. 1 shows a schematic block diagram of a network scenario for a possible application case according to an embodiment of the invention.

FIG. 1 depicts a schematic block diagram of a network scenario for a possible application case according to an embodiment of the invention. In FIG. 1, there is a transmitter (10) (for example, an OFDM transmitter, that is, a transmitter able to transmit signals using an OFDM technique), a receiver (14) (for example, an OFDM receiver, that is, a receiver able to receive signals transmitted using an OFDM technique; the receiver may include a constellation symbol detector) and a communication channel (12) which connects said transmitter with said receiver (that is, the transmitter sends the signals to the receiver through the communication channel).

In an embodiment, the transmitter (10) sends a block (packet) of bits B of size N (13), which represents the information (11) to be conveyed to the receiver. Said block have no error detection bits (like CRC or parity bits) included in it. The information passes through the channel (12) and arrives at the receiver (14), which firstly obtains soft output metrics (15) of the received bits containing suitable information about the associated reliabilities. Reliabilities are usually calculated in the form of a posteriori LLR (Log Likelihood Ratio) values (17). The error prediction block (16) will then find a suitable metric to decide with sufficient reliability whether the received block has errors or not. To do this, the error prediction block will, for example, apply one of the mechanisms that will be explained later.

In the following reasoning, it will be assumed that the receiver is able to obtain soft-output metrics of the received bits (e.g. from the detector), in the form of bit-wise (at bit level) a posteriori log-likelihood ratios (LLRs). Said LLR may be defined by:

$$LLR_n \equiv \ln \frac{p(x_n = +1 \mid y)}{p(x_n = -1 \mid y)} \quad (1)$$

where y denotes the received signal and $x_n$ is the corresponding n-th transmitted bit. LLRs are convenient representations of a posteriori probabilities $p(x_n|y)$ and are usually obtained by maximum a posteriori (MAP) decoders (like turbo decoders) although they can also be obtained in uncoded systems; generally speaking, any well known technique can be used for obtaining them. In this specific case, LLR for the n-th bit ($LLR_n$) is calculated as the logarithm of the ratio of the probability that the n-th transmitted bit is +1 and the probability that the n-th transmitted bit is −1, having received a signal value y for said bit.

A different value, $LLR_n$, will be obtained for each of the received bits (which will depend on the reliabilities in the detection). The received bits are corrupted with random noise, therefore the LLR values will be random variables characterized by a certain probability density function.

The traditional way to check whether a packet was received with errors involves:
  obtaining the hard-decision metric $\hat{x}_n = \text{sgn}(LLR_n)$, where $\hat{x}_n$ is the n-th estimated bit with associated reliability equal to $|LLR_n|$;
  constructing the estimated received block $\hat{B}$ from the set of estimated bits $\hat{x}_n$; and
  checking, with the aid of any suitable error detection code, whether there were errors in the estimated received block $\hat{B}$.

In the present invention, the above stated procedure (especially the third step) does not appy as it is assumed instead that the system has no error detection capabilities (no error detection code included in the block) and block errors must be detected from the soft output estimates of the received bits. To do so, the probability that a given bit is received with error (the probability that the estimated n-th received bit $\hat{x}_n$ is different to the real n-th transmitted bit $x_n$) may be calculated as:

$$\hat{p}(x_n \neq x_n) = \frac{1}{1 + e^{|LLR_n|}} \quad (2)$$

where $LLR_n$ is the obtained Log Likelihood Ratio for the n-th bit.

This expression is used in other prior art documents, as for example, "Error rate estimation based on soft output decoding and its application to turbo coding" by E. Calvanese, S. Simoens, J. Boutros, Proc. IEEE Wireless Communications and Networking Conference (WCNC), 11-15 Mar. 2007, pp. 72-76.

From this expression it is possible to derive the probability that a block of size N bits is in error, by simply considering the joint probability of error of the N received bits. Since bit errors can be assumed to be independent, the probability of error for the received block (packet) of N bits (the probability that the estimated received block $\hat{B}$ is different to the real transmitted block B), denoted as BLEP (block error probability), may be written as:

$$BLEP \equiv p(\hat{B} \neq B) = 1 - \prod_{n=0}^{N-1}(1 - p(\hat{x}_n \neq x_n)) = \quad (3)$$

$$1 - \prod_{n=0}^{N-1}\left(1 - \frac{1}{1 + e^{|LLR_n|}}\right) = 1 - \prod_{n=0}^{N-1}\left(\frac{1}{1 + e^{-|LLR_n|}}\right)$$

where $\pi$ (capital pi) is the multiplication operator. With this equation, the actual BLEP value for the received block ($BLEP_0$) will be obtained.

It is important to emphasize that this block error probability is not sufficient to decide whether the actual received block has errors or not, as it only gives the probability of block error. To this end, the receiver can also collect a set of post-detection signal to noise and interference ratios (SINRs), $\{\gamma_n\}$ (n=0 ... N−1) corresponding to the received bits. Post-detection SINR values are the SINR values characterizing the received bits after the detection stage, which depends on the type of detector employed. These SINR values are routinely obtained in the detection process using well known techniques, as for example, by means of suitable pilot subcarriers, training symbols, or any other well known prior art technique which will be appropriate for the purposes of the the present invention.

The presence of non-uniform profiles of SINR values is characteristic of frequency dispersive channels, as happens for example in wireless cellular channels. Performance of the receiver in presence of frequency dispersive channels is in general worse than that in Additive White Gaussian Noise (AWGN) conditions, where the channel is flat and the signal is only corrupted by additive white Gaussian noise.

The set of SINR values can be exploited to obtain a suitable average Block Error Rate (BLER) estimate through the use of appropriate Link to System techniques (also called Link Abstraction Models), like Exponential Effective SINR Mapping (EESM), Capacity Effective SINR Mapping (CESM), Logarithmic Effective SINR Mapping (LESM) or Mutual Information Effective SINR Mapping (MIESM), to name a few. Such techniques provide an effective SINR value that yields the same block error rate as the system has in AWGN conditions, through a suitable mapping function:

$$I\left(\frac{\gamma_{\mathit{eff}}}{\alpha_1}\right) = \frac{1}{K}\sum_{k=0}^{K-1} I\left(\frac{\gamma_k}{\alpha_2}\right) \quad (4)$$

In the above expression $\gamma_{\mathit{eff}}$ is the effective SINR, I is the mapping function, K is the number of SINR samples that characterize the frequency response of the received channel, and $\alpha_1, \alpha_2$ are design parameters. $\alpha_1, \alpha_2$ can be adjusted to minimize the error between the BLER predicted by the model and the experimental BLER. For example, said parameters may be optimized for minimum squared error between the predicted BLER and the experimental BLER over a number M of channel snapshots, and in said case, their value will be given by the following expression:

$$\{\alpha_1, \alpha_2\} = \quad (5)$$
$$\operatorname{argmin}\left\{\frac{1}{M}\sum_{i=0}^{M-1}[\log(BLER_i) - \log(BLER_{AWGN}(\gamma_{\mathit{eff},i}(\alpha_1, \alpha_2)))]^2\right\}$$

Here $BLER_i$ denotes the experimental BLER obtained for channel snapshot i, $\gamma_{\mathit{eff},i}$ is the effective SINR for snapshot i, and $BLER_{AWGN}$ represents the BLER that would be obtained in AWGN conditions for a given SINR value (this will be used as the predicted, or estimate, average Block Error Rate). Minimization of the mean squared error is performed in the logarithmic domain in order to obtain minimum relative error for the BLER, in such a way that low BLER values can be estimated with low errors and vice versa.

The function I is used to weight the individual SINR values after suitable scaling by parameter $\alpha_2$, while $\alpha_1$ is found to scale the effective SINR value to the region of interest according to the modulation and coding scheme (MCS). Both parameters are in general dependent on the MCS as well as the occupied bandwidth. They can be stored inside the receiver's memory so as to predict the average block error rate for a given set of post detection SINR measurements, $\{\gamma_n\}$, that characterize the received block. In the particular case of MIESM, the function I is the bit-level Mutual Information (MIB) function, while in EESM the function I is an exponential function. The above stated process for obtaining a suitable average Block Error Rate (BLER) estimate from the obtained set of SINR values through the use of appropriate Link to System techniques is well known from the prior art; see for example "Link Abstraction Models based on Mutual Information for LTE Downlink", J. Olmos, S. Ruiz, M. García-Lozano and D. Martín-Sacristán, COST 2100 TD(10)11052, 2-4 Jun. 2010, Aalborg (Denmark)).

A priori knowledge of the average BLER can be exploited in connection with the block error probability BLEP. The latter can be considered a random variable with a probability density function that is in turn a function of the probability density function of the LLR values. Denoting BLEP as the random variable representing the block error probability (the actual BLEP value for the received block will be denoted as $BLEP_0$), taking into account equation (3), a probability density function for the block error probability, $f_{BLEP}$ (BLEP), can be calculated as a function of the probability density function of the LLR values, for example, with the aid of the following transformation:

$$\ln(1-BLEP) = \ln\prod_{n=0}^{N-1}\left(\frac{1}{1+e^{-|LLR_n|}}\right) = -\prod_{n=0}^{N-1}\ln(1+e^{-|LLR_n|}) \quad (6)$$

For given constant conditions of the communications channel, the random variable BLEP will be distributed around a mean value $\langle BLEP \rangle$ which must be equal to the average block error rate BLER (also called expected block error rate), as calculated by the Link to System model, which is in turn a function of the SINR values $\gamma_n$ through the effective SINR $\gamma_{\mathit{eff}}$:

$$\langle BLEP \rangle = BLER_{AWGN}(\gamma_{\mathit{eff}}) \quad (7)$$

Given a computed block error probability $BLEP_0$, neither said $BLEP_0$ nor the expected block error rate can predict whether the received block has errors or not. But, according to the probability density function of BLEP, only a fraction of its possible outcomes will lead to an actual error, and that fraction must be equal to the expected block error rate for the given channel conditions. As a result, the following decision variable can be constructed:

$$p(BLEP > BLEP_0) \quad (8)$$

Equation (8) (the probability that BLEP is above $BLEP_0$) represents the area under the tail of the probability density function of BLEP at the point $BLEP_0$. In an embodiment, the following test can be performed: check whether said decision variable is below the average block error rate $BLER_{AWGN}(\gamma_{\mathit{eff}})$ calculated for the set of SINR values $\gamma_n$ through the effective SINR $\gamma_{\mathit{eff}}$, and in the affirmative case the block is assumed to have errors, otherwise it is assumed to be correctly received:

$$\begin{cases} p(BLEP > BLEP_0 < BLER_{AWGN}(\gamma_{\mathit{eff}}) & \Rightarrow \text{ERROR} \\ \text{else} & \Rightarrow \text{OK} \end{cases} \quad (9)$$

or, more precisely:

$$\begin{cases} \int_{BLEP_0}^{1} f_{BLEP}(BLEP)dBLEP < BLER_{AWGN}(\gamma_{\mathit{eff}}) & \Rightarrow \text{ERROR} \\ \text{else} & \Rightarrow \text{OK} \end{cases} \quad (10)$$

Figure 2:
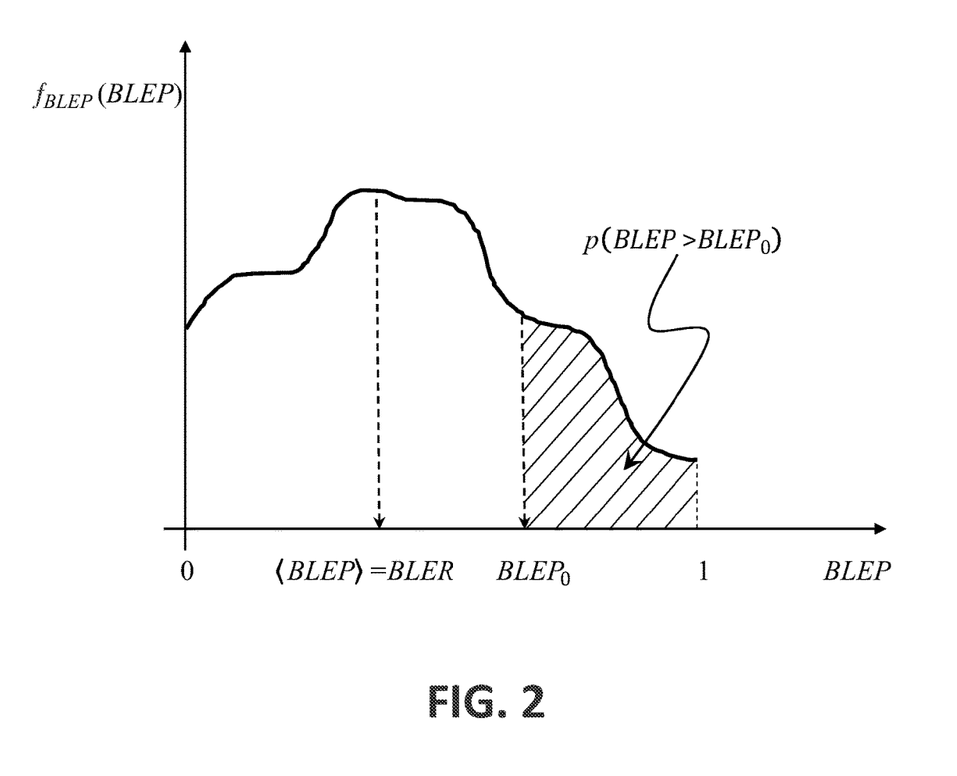
FIG. 2 shows the probability density function of BLEP (Block Error Probability) in order to illustrate the meaning of a proposed decision variable according to an embodiment of the invention.

FIG. 2 illustrates the meaning of the proposed decision variable. The probability density function of BLEP yields the relative frequencies for all the possible outcomes of BLEP, and for given channel conditions (characterized by the set of SINR values $\gamma_n$) it will be distributed around a mean value $\langle BLEP \rangle$ which is equal to the average block error rate, BLER (equation 7). For such channel conditions only a fraction of the possible outcomes for the random variable BLEP will lead to errors in the received block. Such a fraction can be calculated as the area under the tail of the probability density function at the point $BLEP_0$, and must be equal to the average block error rate, BLER. Therefore a suitable test comprises checking whether said tail area, which represents the decision variable, is below or above the calculated BLER value, which represents the decision threshold.

In another embodiment, the logarithm of the ratio of the tail area and the expected block error rate (which is an LLR magnitude for the block error) is used as an equivalent decision variable which will be compared with zero for error decisions. That is:

$$LLR_{BlockError} \equiv \ln \frac{p(BLEP > BLEP_0)}{BLER_{AWGN}(\gamma_{eff})} \Rightarrow \begin{cases} > 0 \Rightarrow OK \\ < 0 \Rightarrow ERR \end{cases} \quad (11)$$

Reliability may be given by the absolute magnitude $|LLR_{BlockError}|$. $LLR_{BlockError}$ values with high absolute magnitude will lead to high reliability in the decision, while $LLR_{BlockError}$ values close to 0 will be more unreliable. Final decisions for block errors could be biased so as to minimize false positives: as an example, a system could decide that all received blocks are in error unless the decision variable yields "OK" (according for example to equation (9)) with reliability level above some threshold. Other criteria are also possible depending on the tolerance of the system to detection errors.

It is possible to numerically obtain the probability density function of ln(1−BLEP), as a function of the probability density functions of the bit-wise LLR values as obtained for a given SINR. The probability density functions of the bit-wise LLR values can be stored in advance at the receiver's memory as a function of the effective SINR or the estimated BLER value. With them, it is possible to construct the probability density function for the block error probability BLEP. Numerical calculation of the area under such probability density function from the value $BLEP_0$ up to 1 will lead to check whether the received block has errors or not, with a reliability given by $|LLR_{BlockError}|$.

As stated before, main applications for the proposed invention are communications with very small packet lengths (as for example machine-type communications), which therefore alleviate the complexity in obtaining the described probability density function. However application for larger packets is also possible provided that the receiver has larger computation capabilities, although the benefits of avoiding the overhead from the CRC will decrease with the packet length.

Figure 3:
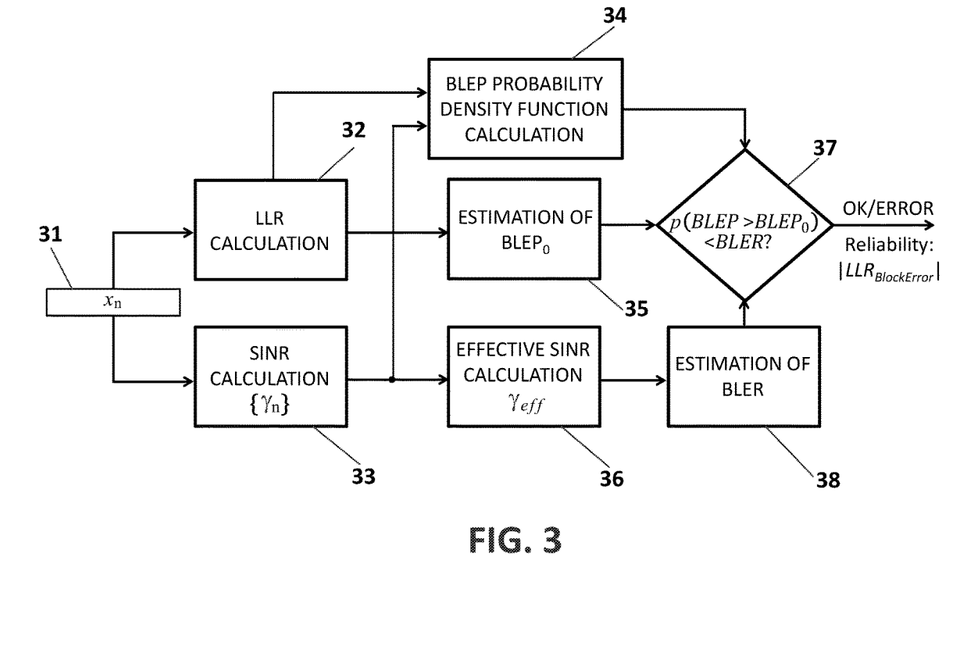
FIG. 3 shows a flow diagram of the processss to predict errors in a received block according to an embodiment of the invention.

FIG. 3 illustrates a flow diagram according to an embodiment of the invention, which would be operating at the receive side of an OFDM communications system. A block (31) (for example a data packet) of N bits, ($x_n$, n=0 ... N−1) is received (not containing any additional bits for error detection) in a receiver comprising a symbol detector (for example a constellation symbol detector). Then, the receiver calculates (32) the (bit-wise) a posteriori log-likelihood ratios of the received bits after the detector, $LLR_n$ defined by:

$$LLR_n \equiv \ln \frac{p(x_n = +1 \mid y)}{p(x_n = -1 \mid y)}, n = 0, \ldots, N-1,$$

where $LLR_n$ denotes the log-likelihood ratio of the received n-th bit, y denotes the received signal, $x_n$ is the corresponding n-th transmitted bit, and N is the number of bits in the received block.

On the other hand, LLR values lead to an estimation of the actual block error probability for the received block (e.g. a packet), $BLEP_0$ (35), by means of the following expression:

$$BLEP_0 = 1 - \prod_{n=0}^{N-1} \left( \frac{1}{1 + e^{-|LLR_n|}} \right);$$

The set of post-detection SINR values $\{\gamma_n\}$ (33) that characterize the received block is also calculated (estimated). From the set of obtained SINR values $\{\gamma_n\}$, the effective SINR, $\gamma_{eff}$ (36) can also be obtained with the aid of Link to System techniques. Said effective SINR is the SINR that yields the same average block error rate as the system has over an additive White Gaussian Noise channel. This is calculated by means of any suitable Link to System technique (as EESM, CESM, LESM, MIESM ...) through the expression:

$$I\left(\frac{\gamma_{eff}}{\alpha_1}\right) = \frac{1}{K} \sum_{k=0}^{K-1} I\left(\frac{\gamma_k}{\alpha_2}\right),$$

where $\gamma_{eff}$ is said effective SINR, I is the mapping function, K is the number of SINR samples that characterize the frequency response of the received channel, and $\alpha_1, \alpha_2$ are parameters that may be optimized for minimum squared error between the predicted BLER and the experimental BLER.

Such effective SINR yields an estimation of the average block error rate, BLER (38). The average block error rate can be estimated from said effective SINR value as the expression $BLER_{AWGN}(\gamma_{eff})$, where $\gamma_{eff}$ is said effective SINR and $BLER_{AWGN}$ represents the BLER that would be obtained in AWGN conditions for a given SINR value.

With the aid of said SINR values and the calculated LLRs the receiver obtains a probability density function of the block error probability, BLEP (34). Said probability density function, $f_{BLEP}(BLEP)$, can be calculated as a function of the probability density function of the LLR values with the aid of (using) the following transformation:

$$\ln(1 - BLEP) = -\sum_{n=0}^{N-1} \ln(1 + e^{-|LLR_n|}),$$

where said block error probability, BLEP is a random variable with a mean value given by said average block error rate, $\langle BLEP \rangle = BLER_{AWGN}(\gamma_{eff})$.

With the obtained values for BLER and $BLEP_0$ and the probability density function of BLEP, a decision variable (37) is formed as:

$$p(BLEP > BLEP_0) \equiv \int_{BLEP_0}^{1} f_{BLEP}(BLEP) dBLEP$$

Then, it is determined whether the received block has errors using said decision variable. In an embodiment, this is made by checking whether the probability of having BLEP values above $BLEP_0$ is lower than the value of the estimated average BLER (with the average block error rate BLER$_{AWGN}$($\gamma_{eff}$)). Or in other words, comparing said decision variable with the average block error rate BLER$_{AWGN}$ ($\gamma_{eff}$). In the affirmative case, it is considered that the received block has errors; otherwise the block is considered to be correctly received. If it is estimated that the received block has errors an appropriate prompt action can be triggered, as for example discarding said packet and/or sending a response to the transmitter such as a request for retransmission or a similar action (without having to wait for the application layer to react to a missing packet).

The associated reliability of block error prediction may be also estimated, for example, by means of the absolute magnitude of the log-likelihood ratio of the block error, |LLR$_{BlockError}$| defined by the expression:

$$LLR_{BlockError} \equiv \ln \frac{p(BLEP > BLEP_0)}{BLER_{AWGN}(\gamma_{eff})}.$$

If the absolute magnitude of the above expression is much greater than zero then high reliability can be assumed for block error prediction, otherwise it will have low reliability.

In another embodiment, the received block is considered to have errors when said decision variable p(BLEP>BLEP$_0$) is below said average block error rate BLER$_{AWGN}$($\gamma_{eff}$), and said reliability |LLR$_{BlockError}$| is above a pre-determined threshold.

In an embodiment, if correction codes are used, the LLR values are obtained after Error Correction decoding (for example, Forward Error Correction, FEC, decoding) of the received bits. If correction codes are not used, the LLR values are obtained after constellation symbol detection. Any well known technique for obtaining the LLR values can be used for the purposes of the present invention.

The present invention can be used in any type of OFDM communication systems, especially in OFDM communication systems such as Long-Term Evolution, LTE, wireless cellular system, an IEEE 802.11, WiFi system, an IEEE 802.16, WiMAX system or any other type of OFDM communications system.

Summarizing, the present invention proposes a method to predict whether a received block has errors in an OFDM communications system without resorting to the use of any error detection codes. This scenario is particularly attractive in applications with very small packets (like machine-type applications), where parity or CRC bits may represent a significant portion of the resulting packet thereby impairing spectral efficiency.

The proposed invention can predict the probability of having a block error from the a posteriori log-likelihood ratios of the received bits. The a posteriori LLR values may be obtained after FEC decoding, but may also be obtained after the detector in systems without FEC capabilities. Knowledge of the post-detection SINR values characterizing the received bits can bring an estimate of the average block error rate, as obtained by Link to System techniques. From the received LLR values it is possible to derive the block error probability of the received block. This, in conjunction with the average block error rate and the probability density function of the block error probability, can be used to decide whether the received block has errors or not, along with the corresponding reliability of the decision. Such reliability can be used to bias block error decisions so as to minimize false positives; for example, the system could be designed to consider all received blocks as errors unless the decision yields an "OK" and the associated reliability is above some threshold.

Having a decision variable for block errors is very attractive in applications with no error detection capabilities, where the receiver cannot trigger any action at physical layer level and has to wait instead for the application layer. Application of the present invention to large packets is also possible provided that the receiver has sufficient processing capabilities for computation of the probability density function of the block error probability.

The proposed embodiments can be implemented as a collection of software elements, hardware elements, firmware elements, or any suitable combination of them.

Note that in this text, the term "comprises" and its derivations (such as "comprising", etc.) should not be understood in an excluding sense, that is, these terms should not be interpreted as excluding the possibility that what is described and defined may include further elements, steps, etc.

A person of skill in the art would readily recognize that steps of various above-described methods can be performed by programmed computers. Herein, some embodiments are also intended to cover program storage devices, e.g., digital data storage media, which are machine or computer readable and encode machine-executable or computer-executable programs of instructions, wherein said instructions perform some or all of the steps of said above-described methods. The program storage devices may be, e.g., digital memories, magnetic storage media such as a magnetic disks and magnetic tapes, hard drives, or optically readable digital data storage media. The embodiments are also intended to cover computers programmed to perform said steps of the above-described methods. The description and drawings merely illustrate the principles of the invention.

Although the present invention has been described with reference to specific embodiments, it should be understood by those skilled in the art that the foregoing and various other changes, omissions and additions in the form and detail thereof may be made therein without departing from the scope of the invention as defined by the following claims. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof. It should be appreciated by those skilled in the art that any block diagrams herein represent conceptual views of illustrative circuitry embodying the principles of the invention.

What is claimed is:

1. A method for detecting errors in an information block in an Orthogonal Frequency-Division Multiplexing, OFDM, network, where the information block is received by an OFDM receiver through a communication channel and contains N bits, the method characterized by comprising the following steps performed by the receiver:
   a) Obtaining an a posteriori log-likelihood ratio, LLR, value for each received bit of the block;
   b) Calculating a probability of error for the received block, BLEP$_0$, based on the calculated LLR values;

c) Calculating an average block error rate for the received block, based on post-detection Signal to Interference and Noise Ratios, SINR, of the received bits;
d) Obtaining a probability density function of the block error probability, BLEP, based on the probability density function of the LLR values, where the block error probability is a random variable with a mean value given by the average block error rate;
e) Calculating a decision variable value, where the decision variable value is a function of the probability density function of the block error probability and $BLEP_0$;
f) Comparing the decision variable value with a first threshold and determining whether the received block has errors based at least on a result of said comparison.

2. The method according to claim 1, where the decision variable is the probability that the block error probability, BLEP, is higher than $BLEP_0$.

3. The method according to claim 1, where the first threshold is the calculated average block error rate.

4. The method according to claim 1 where the method further comprises calculating a block error detection reliability, $LLR_{BlockError}$, and determining that the received block has errors only if said block error reliability is above a second threshold.

5. The method according to claim 4 where the block error reliability is calculated as the logarithm of the ratio between the decision variable and the average block error rate.

6. The method according to claim 1 where the LLR values are defined as:

$$LLR_n \equiv \ln \frac{p(x_n = +1 \mid y)}{p(x_n = -1 \mid y)}, n = 0, \ldots, N-1,$$

where $LLR_n$ denotes the a posteriori log-likelihood ratio of the received n-th bit of the block, y denotes the received signal, $x_n$ is the corresponding n-th transmitted bit and p denotes the a-posteriori probability.

7. The method according to claim 1 where the probability density function of the block error probability, $f_{BLEP}(BLEP)$ is calculated as a function of the probability density function of the LLR values, using the following transformation:

$$\ln(1 - BLEP) = -\sum_{n=0}^{N-1} \ln(1 + e^{-|LLR_n|})$$

where $LLR_n$ denotes the a posteriori log-likelihood ratio of the received n-th bit of the block.

8. The method according to claim 1 where the decision variable is calculated as:

$$\int_{BLEP_0}^{1} f_{BLEP}(BLEP) d BLEP,$$

where $f_{BLEP}(BLEP)$ is the probability density function of the block error probability BLEP.

9. The method according to claim 1 where the probability of error for the received block, $BLEP_0$ is calculated as:

$$BLEP_0 = 1 - \prod_{n=0}^{N-1} \left( \frac{1}{1 + e^{-|LLR_n|}} \right)$$

where $LLR_n$ denotes the a posteriori log-likelihood ratio of the received n-th bit of the block.

10. The method according to claim 1 where the block is transmitted by an OFDM transmitter without including any error detection bits.

11. The method according to claim 1 where the LLR values are obtained after Forward Error Correction, FEC, decoding of the received bits.

12. The method according to claim 1 where calculation of an average block error rate for the received block includes:
Obtaining post-detection SINR values for each received bit of the block;
From said post-detection SINR values, calculating an effective SINR by means of a Link to System technique;
Calculating the average block error rate as the block error rate that would be obtained if the communication channel would have been an Additive White Gaussian Noise Channel for the effective SINR value calculated.

13. A non-transitory digital data storage medium storing a computer program comprising instructions, causing a computer executing the program to perform all steps of the method according to claim 1, when the program is run on a computer.

14. An OFDM receiver for detecting errors in an information block received through a communication channel of an OFDM network, where the information block contains N bits, the receiver comprising:
A constellation symbol detector for obtaining the soft output metrics of the received bits included in the information block
Means for:
Obtaining an a posteriori log-likelihood ratio, LLR, value for each received bit of the block;
Calculating a probability of error for the received block, $BLEP_0$ based on the calculated LLR values;
Calculating an average block error rate for the received block, based on post-detection Signal to Interference and Noise Ratios of the received bits;
Calculating a probability density function of the block error probability based on the probability density function of the LLR values, where the block error probability is a random variable with a mean value given by the average block error rate;
Calculating a decision variable value, where the decision variable value is a function of the probability density function of the block error probability and $BLEP_0$;
Comparing the decision variable value with a first threshold and determining whether the received block has errors based at least on a result of said comparison.

15. A system for detecting errors in an information block in a OFDM network comprising the OFDM receiver according to claim 14 and an OFDM transmitter with means for transmitting an information block through an OFDM wireless channel to the OFDM receiver.

* * * * *